(12) United States Patent
Roh et al.

(10) Patent No.: US 9,643,389 B2
(45) Date of Patent: May 9, 2017

(54) PLASTIC WINDOW AND ORGANIC LIGHT-EMITTING DISPLAY APPARATUS INCLUDING THE SAME

(71) Applicant: Samsung Display Co., Ltd., Yongin, Gyeonggi-Do (KR)

(72) Inventors: Hyoung-Suk Roh, Yongin (KR); Ju-Suk Oh, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 297 days.

(21) Appl. No.: 14/245,247

(22) Filed: Apr. 4, 2014

(65) Prior Publication Data

US 2014/0374710 A1 Dec. 25, 2014

(30) Foreign Application Priority Data

Jun. 24, 2013 (KR) ........................ 10-2013-0072711

(51) Int. Cl.
*B32B 33/00* (2006.01)
*B32B 27/36* (2006.01)
(Continued)

(52) U.S. Cl.
CPC ................ *B32B 33/00* (2013.01); *B32B 7/12* (2013.01); *B32B 27/08* (2013.01); *B32B 27/36* (2013.01); *B32B 27/365* (2013.01); *H01L 27/323* (2013.01); *H01L 51/0097* (2013.01); *B32B 2250/02* (2013.01); *B32B 2255/10* (2013.01);
(Continued)

(58) Field of Classification Search
CPC ....... B32B 33/00; B32B 27/365; B32B 27/08; B32B 27/36; B32B 7/12; B32B 2255/24; B32B 2255/10; B32B 2457/208; B32B 2457/206; B32B 2250/02; B32B 2307/412; B32B 2367/00; B32B 2457/20208; H01L 27/323; H01L 51/0097; H01L 51/5281; Y02E 10/549; Y10T 428/2495; Y10T 428/269; Y10T 428/31551; C09D 167/00; C08J 7/04; C08J 7/042

See application file for complete search history.

(56) References Cited

U.S. PATENT DOCUMENTS 6,572,941 B1 6/2003 Murakami et al.
2007/0091074 A1* 4/2007 Nashiki .................. B32B 3/085
345/173

(Continued)

FOREIGN PATENT DOCUMENTS

JP 11-320744 A 11/1999
JP 2002-250814 A 9/2002
(Continued)

*Primary Examiner* — Anne Hines
*Assistant Examiner* — Jose M Diaz
(74) *Attorney, Agent, or Firm* — Lee & Morse, P.C.

(57) ABSTRACT

A plastic window and an organic light-emitting display apparatus, the plastic window including a first layer; a second layer stacked on the first layer; and coating layers on a bottom surface of the first layer and on a top surface of the second layer, respectively, the top surface of the second layer facing a direction opposite to that of the bottom surface of the first layer, wherein the first layer and the second layer each include polyethylene terephthalate, and the first layer has the same thickness as the second layer.

16 Claims, 3 Drawing Sheets

(51) Int. Cl.
*H01L 51/00* (2006.01)
*H01L 27/32* (2006.01)
*B32B 7/12* (2006.01)
*B32B 27/08* (2006.01)
*H01L 51/52* (2006.01)

(52) U.S. Cl.
CPC ..... *B32B 2255/24* (2013.01); *B32B 2307/412* (2013.01); *B32B 2367/00* (2013.01); *B32B 2457/206* (2013.01); *B32B 2457/208* (2013.01); *H01L 51/5281* (2013.01); *Y02E 10/549* (2013.01); *Y10T 428/2495* (2015.01)

(56) References Cited

U.S. PATENT DOCUMENTS

| | | | | |
|---|---|---|---|---|
| 2010/0134879 A1* | 6/2010 | Yoshihara | | B32B 27/30 359/361 |
| 2013/0265256 A1* | 10/2013 | Nathan | | G06F 3/0414 345/173 |
| 2014/0111711 A1* | 4/2014 | Iwami | | B32B 7/02 349/12 |
| 2014/0239276 A1* | 8/2014 | Lin | | H01L 27/3244 257/40 |
| 2015/0140279 A1* | 5/2015 | Kang | | G02B 1/105 428/174 |
| 2015/0166818 A1* | 6/2015 | Kang | | C09D 133/14 428/213 |
| 2015/0277110 A1* | 10/2015 | Oh | | G02B 27/0006 359/513 |
| 2016/0018578 A1* | 1/2016 | Yonemoto | | B32B 7/12 359/487.02 |

FOREIGN PATENT DOCUMENTS

JP   2010-214601 A   9/2010
WO   WO/2013/008826   *   1/2013

* cited by examiner

PLASTIC WINDOW AND ORGANIC LIGHT-EMITTING DISPLAY APPARATUS INCLUDING THE SAME

CROSS-REFERENCE TO RELATED APPLICATION

Korean Patent Application No. 10-2013-0072711, filed on Jun. 24, 2013, in the Korean Intellectual Property Office, and entitled: "Plastic Window and Organic Light-Emitting Display Apparatus Including The Same," is incorporated by reference herein in its entirety.

BACKGROUND

1. Field

Embodiments relate to a plastic window and an organic light-emitting display apparatus including the same.

2. Description of the Related Art

Displays that visually express various electrical signal information have been rapidly developed, and various flat panel display apparatuses having superior characteristics, e.g., small size, light weight, and low power consumption, have been introduced. Examples of flat panel display apparatuses may include organic light-emitting display apparatuses, plasma display apparatuses, liquid crystal display (LCD) apparatuses, and field emission display apparatuses. Organic light-emitting display apparatuses may be manufactured to have a small size and a light weight and may have wide viewing angles, fast response rates and low power consumption and thus have drawn attention as next generation display apparatuses.

SUMMARY

Embodiments are directed to a plastic window and an organic light-emitting display apparatus including the same.

The embodiments may be realized by providing a plastic window including a first layer; a second layer stacked on the first layer; and coating layers on a bottom surface of the first layer and on a top surface of the second layer, respectively, the top surface of the second layer facing a direction opposite to that of the bottom surface of the first layer, wherein the first layer and the second layer each include polyethylene terephthalate, and the first layer has the same thickness as the second layer.

The plastic window may further include a third layer between the first layer and the second layer, the plastic window having a vertically symmetric structure with respect to a plane of symmetry that extends along a center of the third layer.

The third layer may include polyethylene terephthalate.

The third layer may include polycarbonate.

The first layer may be adhered to the second layer with a first optical clear adhesive.

The first layer may be adhered to the third layer with a second optical clear adhesive, and the second layer may be adhered to the third layer with the second optical clear adhesive.

The plastic window may have a vertically symmetric structure with respect to a plane of symmetry that passes between the first layer and the second layer.

The embodiments may be realized by providing an organic light-emitting display apparatus including a display unit; a touch panel on the display unit; and a plastic window attached onto the touch panel, wherein the plastic window includes a first layer on the touch panel; and a second layer stacked on the first layer, and wherein the first layer and the second layer each include polyethylene terephthalate, and the first layer has the same thickness as the second layer.

A difference in thermal expansion coefficients between the touch panel and the plastic window may be less than or equal to 20 ppm.

The plastic window may further include hard coating layers on a bottom surface of the first layer and a top surface of the second layer, respectively, the top surface of the second layer facing an opposite direction relative to that of the bottom surface of the first layer.

The plastic window may further include a third layer between the first layer and the second layer, the plastic window having a vertically symmetric structure with respect to a plane of symmetry that extends along a center of the third layer.

The third layer may include polyethylene terephthalate.

The third layer may include polycarbonate.

The organic light-emitting display apparatus may further include an encapsulating layer on the display unit, wherein the display unit includes an organic light-emitting device, and the encapsulating layer seals the display unit.

The touch panel may be directly on the encapsulating layer.

The organic light-emitting display apparatus may further include a polarizer between the encapsulating layer and the touch panel.

The plastic window may have a vertically symmetric structure with respect to a plane of symmetry that passes between the first layer and the second layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
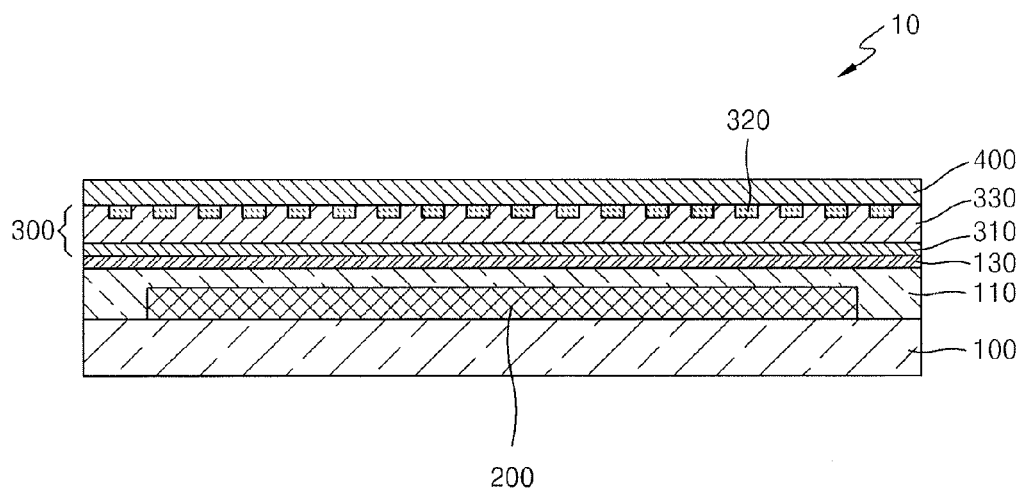
FIG. 1 illustrates a cross-sectional view of an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

While such terms as "first," "second," etc., may be used to describe various components, such components must not be limited to the above terms. The above terms are used only to distinguish one component from another.

The terms used in the present specification are merely used to describe particular embodiments, and are not intended to limit the embodiments. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

As used herein, the term "and/or" includes any and all combinations of one or more of the associated listed items.

Figure 2:
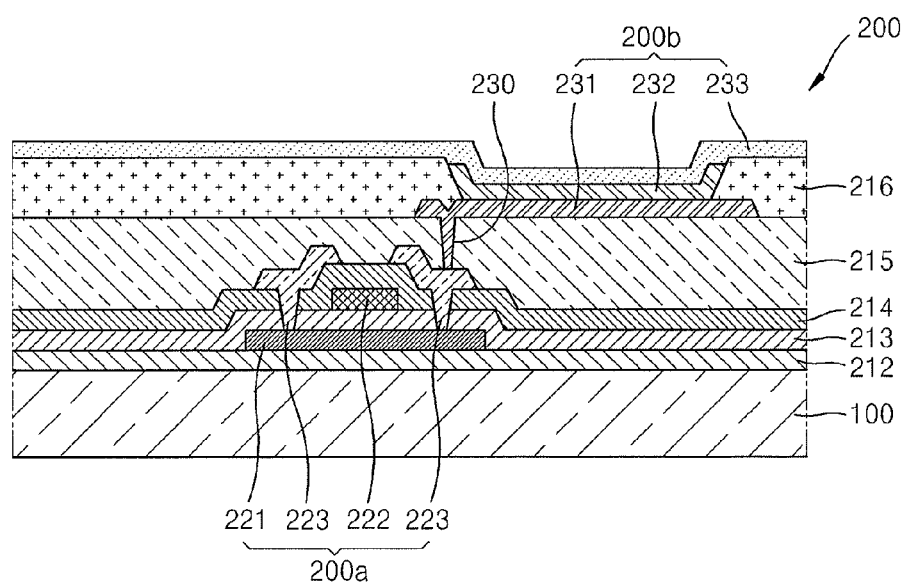
FIG. 2 illustrates a cross-sectional view of a display unit of the organic light-emitting display apparatus illustrated in FIG. 1.
Figure 3:
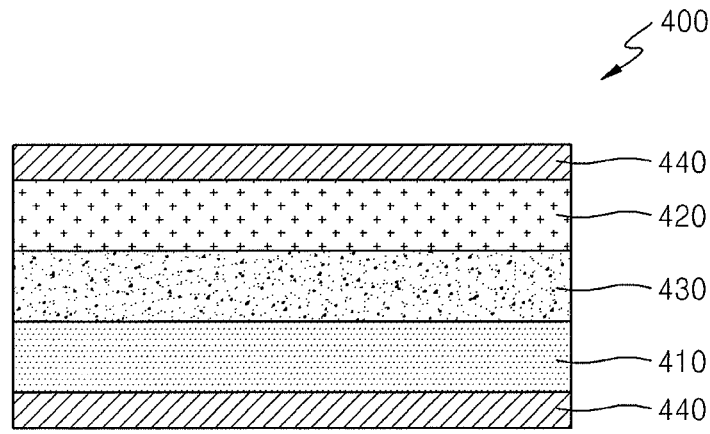
FIG. 3 illustrates a cross-sectional view of a plastic window of the organic light-emitting display apparatus of FIG. 1.

FIG. 1 illustrates a cross-sectional view of an organic light-emitting display apparatus according to an embodiment, FIG. 2 illustrates a cross-sectional view of a display unit of the organic light-emitting display apparatus illustrated in FIG. 1, and FIG. 3 illustrates a cross-sectional view of a plastic window of the organic light-emitting display apparatus of FIG. 1.

Referring to FIGS. 1 through 3, an organic light-emitting display apparatus 10 according to an embodiment may include a substrate 100, a display unit 200 on the substrate 100, a touch panel 300 on the display unit 200, and a plastic window 400 attached onto the touch panel 300.

The substrate 100 may be formed of or may include a transparent glass material having a main component of $SiO_2$. In an implementation, the substrate 100 may be formed of or may include a transparent plastic material. The plastic material used in forming the substrate 100 may be, e.g., an insulating organic material selected from the group of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

When the organic light-emitting display apparatus 10 is a bottom emission type (in which an image is displayed in a direction of the substrate 100), the substrate 100 may be formed of a transparent material. When the organic light-emitting display apparatus 10 is a top emission type (in which an image is displayed in an opposite direction to the direction of the substrate 100), the substrate 100 may not necessarily be formed of a transparent material. For example, the substrate 100 may be formed of or may include a metal. When the substrate 100 is formed of or includes a metal, the substrate 100 may include at least one selected from the group of carbon, iron, chromium, manganese, nickel, titanium, molybdenum, and stainless steel (SUS).

The display unit 200 may include an organic thin film transistor 200a and a pixel unit 200b. The pixel unit 200b may be an organic light-emitting device OLED. Hereinafter, the display unit 200 will be described with reference to FIG. 2 in more detail.

A buffer layer 212 may be formed on the substrate 100. The buffer layer 212 may help prevent an impurity element from permeating through the substrate 100 and may provide a flat surface to an upper portion of the substrate 100. The buffer layer 212 may be formed of or may include various materials that may be conducive to performing these functions. For example, the buffer layer 212 may include an inorganic material, such as a silicon oxide, a silicon nitride, a silicon oxynitride, an aluminum oxide, an aluminum nitride, a titanium oxide, or a titanium nitride, an organic material, such as polyimide, polyester, or acryl, or may be formed of a plurality of stacked layers formed of the inorganic material and the organic material.

The buffer layer 212 may be deposited using various deposition methods, e.g., a plasma enhanced chemical vapor deposition (PECVD) method, an atmospheric pressure CVD (APCVD) method, or a low pressure CVD (LPCVD) method.

An active layer 221 (e.g., of an inorganic semiconductor such as silicon or an organic semiconductor) may be formed on the buffer layer 212 by. The active layer 221 may include a source region, a drain region, and a channel region between the source region and the drain region. For example, when the active layer 221 is formed of or includes amorphous silicon, an amorphous silicon layer may be formed on an entire surface of the substrate 100 and then may be crystallized to form a polysilicon layer, the polysilicon layer may be patterned, and an impurity may be doped into the source region and the drain region of edges of the active layer 221, thereby forming the active layer 221 (including the source region, the drain region, and the channel region between the source region and the drain region).

A gate insulating layer 213 may be formed on the active layer 221. The gate insulating layer 213 may insulate the active layer 221 and a gate electrode 222 from each other and may be formed of or may include an inorganic material, e.g., SiNx or $SiO_2$.

The gate electrode 222 may be formed in a predetermined region of an upper portion of the gate insulating layer 213. The gate electrode 222 may be connected to a gate line (not shown) that applies an on/off signal of a thin film transistor TFT 200a.

The gate electrode 222 may include, e.g., Au, Ag, Cu, Ni, Pt, Pd, Al, or Mo or an alloy, such as Al:Nd or Mo:W. In an implementation, the gate electrode 222 may be formed of or may include one of various suitable materials in consideration of a design condition.

An interlayer insulating layer 214 (formed on the gate electrode 222) may insulate the gate electrode 222 and source and drain electrodes 223, and may be formed of or may include an inorganic material, such as SiNx or $SiO_2$.

The source and drain electrodes 223 may be formed on the interlayer insulating layer 214. For example, the interlayer insulating layer 214 and the gate insulating layer 213 may expose the source and drain regions of the active layer 221, and the source and drain electrodes 223 may contact the exposed source and drain regions of the active layer 221.

FIG. 2 illustrates a top gate type thin film transistor TFT 200a that sequentially includes the active layer 221, the gate electrode 222, and the source and drain electrodes 223. In an implementation, the gate electrode 222 may be below the active layer 221.

The thin film transistor TFT 200a may be electrically connected to the pixel unit 200b, may drive the pixel unit 200b, and may be covered with a planarization layer 215 to thereby be protected.

The planarization layer 215 may be an inorganic insulating layer and/or an organic insulating layer. The inorganic insulating layer may include, e.g., $SiO_2$, SiNx, SiON, $Al_2O_3$, $TiO_2$, $Ta_2O_5$, $HfO_2$, $ZrO_2$, BST, or PZT. The organic insulating layer may include, e.g., a suitable polymer, such as PMMA or PS, polymer derivatives having a phenol-based group, an acryl-based polymer, an imide-based polymer, an arylether-based polymer, an amide-based polymer, a fluorine-based polymer, a p-xylene-based polymer, a vinylalcohol-based polymer, or a blend thereof. The planarization layer 215 may be formed of a plurality of stacked layers including the inorganic insulating layer and the organic insulating layer.

The pixel unit 200b may be formed on the planarization layer 215. The pixel unit 200b may include a pixel electrode 231, an intermediate layer 232, and an opposite electrode 233.

The pixel electrode 231 may be formed on the planarization layer 215 and may be electrically connected to the source and drain electrodes 223 through a contact hole 230 in the planarization layer 215.

The pixel electrode 231 may be a reflection electrode and may include a reflection layer formed of or including at least one material selected from the group of Ag, Mg, Al, Pt, Pd, Au, Ni, Nd, Ir, Cr, or a combination thereof, and a transparent or semitransparent electrode layer on the reflection layer. The transparent or semitransparent electrode layer may include at least one selected from the group of indium tin oxide (ITO), indium zinc oxide (IZO), zinc oxide (ZnO), indium oxide ($In_2O_3$), indium gallium oxide (IGO), and aluminum zinc oxide (AZO).

The opposite electrode 233 (facing the pixel electrode 231) may be a transparent or semitransparent electrode and may be formed of a metal thin layer having a small work function including at least one selected from the group of Li, Ca, LiF/Ca, LiF/Al, Al, Ag, Mg, or a combination thereof. An auxiliary electrode layer or a bus electrode may be further formed on the metal thin layer using a material used in forming a transparent electrode, e.g., ITO, IZO, ZnO, or $In_2O_3$.

Thus, the opposite electrode 233 may allow light emitted from an organic emission layer (not shown) included in the intermediate layer 232 to transmit. For example, light emitted from the organic emission layer (not shown) may be directly reflected or may be reflected by the pixel electrode 231 (e.g., the reflection electrode) and may be emitted toward the opposite electrode 233.

In an implementation, the organic light-emitting display apparatus 10 according to the present embodiment may be a bottom emission type in which light emitted from the organic emission layer (not shown) is emitted in a direction of the substrate 100. In this case, the pixel electrode 231 may be a transparent or semitransparent electrode, and the opposite electrode 233 may be a reflection electrode. The organic light-emitting display apparatus 10 according to the present embodiment may also be a dual emission type in which light is emitted in both directions including forward and backward directions.

A pixel defining layer 216 may be formed on the pixel electrode 231 using an insulating material. The pixel defining layer 216 may be formed of or may include at least one organic insulating material selected from the group of polyimide, polyamide, an acryl resin, benzocyclobutene (BCB), and a phenol resin using, e.g., spin coating. The pixel defining layer 216 may expose a predetermined region of the pixel electrode 231, and the intermediate layer 232 including the organic emission layer may be positioned in the exposed region of the pixel electrode 231.

The organic emission layer (not shown) included in the intermediate layer 232 may be formed of a low molecular weight organic material or a polymer organic material. The intermediate layer 232 may further include a functional layer, e.g., a hole transport layer (HTL), a hole injection layer (HIL), an electron transport layer (ETL), or an electron injection layer (EIL), selectively in addition to the organic emission layer (not shown).

The display unit 200 may not require an additional light source, and thus may be driven with a low voltage, may be manufactured to have a light weight and a small size and may have a high contrast and a fast response rate. An organic light-emitting device OLED may be deteriorated if external moisture or oxygen were to penetrate the device.

An encapsulating layer 110 may seal the display unit 200 to help protect the organic light-emitting device OLED from external moisture or oxygen.

The encapsulating layer 110 may be formed by alternately stacking at least one organic layer and at least one inorganic layer. When a plurality of organic layers and a plurality of inorganic layers are alternately stacked, a top layer may be an inorganic layer so as to more effectively prevent moisture from permeating through the organic light-emitting device OLED.

The organic layer may be formed of a polymer, e.g., the organic layer may be a single layer or a stacked layer formed of any one of polyethylene terephthalate, polyimide, polycarbonate, epoxy, polyethylene, and polyacrylate. For example, the organic layer may be formed of polyacrylate or may include a polymerized monomer composition (that includes a diacrylate-based monomer and a triacrylate-based monomer). A monoacrylate-based monomer may be further included in the polymerized monomer composition. Also, the polymerized monomer composition may further include a photoinitiator, e.g., TPO.

The inorganic layer may be a single layer or a stacked layer including a metal oxide or a metal nitride. For example, the inorganic layer may include any one of SiNx, $Al_2O_3$, $SiO_2$, or $TiO_2$.

In an implementation, the touch panel 300 may be formed directly on the encapsulating layer 110. For example, the organic light-emitting display apparatus 10 may not include an additional substrate (not shown) for forming the touch panel 300 and thus may be manufactured to have a smaller size.

The touch panel 300 may use, e.g., a touch method using capacitance overlay. The touch panel 300 may include a metal wiring 310, sensing patterns 320, and a dielectric between the metal wiring 310 and the sensing patterns 320. The touch panel 300 may transfer a change of capacitance overlay of the sensing patterns 320 caused by an external touch to an integrated circuit (not shown) via the metal wiring 310.

The metal wiring 310 and the sensing patterns 320 may be formed of a light-transmitting metal-containing material, e.g., ITO, IZO, or IAZO. In an implementation, a dielectric 330 may be formed of, e.g., a nitride-based compound such as SiNx, or an oxide-based compound such as AlOx. Thus, the dielectric 330 may function as another one inorganic layer, and the sealing effect of the display unit 300 may be further enhanced.

A polarizer 130 may be disposed between the encapsulating layer 110 and the touch panel 300. The polarizer 130 may help improve straightness of light emitted from the display unit 200 to help prevent scattering or interference and to help improve a color sense. Also, the polarizer 130 may sort and transmit external light and may help prevent reflection of external light to help improve image recognition of the organic light-emitting display apparatus 10.

The plastic window 400 may be attached onto the touch panel 300. The plastic window 400 may be a portion of the device that is contacted by a user's hand or an object and may help prevent damage of the touch panel 300. The plastic window 400 may be attached onto the touch panel 300 using an adhesive.

The plastic window 400 may be formed of or may include a polymer material, and the touch panel 300 may be formed of or may include a metal or an inorganic material, so that thermal expansion coefficients between the plastic window 400 and the touch panel 300 may be different from each other. If a difference in thermal expansion coefficients between the plastic window 400 and the touch panel 300 were to be too large, the plastic window 400 could be peeled off. According to an embodiment, the difference in thermal expansion coefficients between the plastic window 400 and the touch panel 300 may be less or equal to 20 ppm, e.g., about 20 ppm or less.

Referring to FIG. 3, the plastic window 400 may include a first layer 410, a second layer 420 stacked on the first layer 410, and coating layers 440 on a bottom surface of the first layer 410 and a top surface of the second layer 420, respectively. For example, the coating layers 440 may be on outer, opposite facing surfaces of the first layer 410 and the second layer 420. In an implementation, the first layer 410 and the second layer 420 may be formed of or may include, e.g., polyethylene terephthalate.

Polyethylene terephthalate has a thermal expansion coefficient of about 10 to about 20 ppm, e.g., which is smaller than those of other polymer materials. Thus, the first layer 410 and the second layer 420 may be formed of or may include polyethylene terephthalate so that an entire thermal expansion coefficient of the plastic window 400 may be decreased. Thus, a difference in thermal expansion coefficients between the touch panel 300 (which may have a thermal expansion coefficient of about 8 to about 10 ppm) and the plastic window 400 may be reduced. Thus, adhesion reliability of the plastic window 400 may be improved.

The first layer 410 and the second layer 420 may be adhered to each other by a first optical clear adhesive 430. The first layer 410 and the second layer 420 may have the same thicknesses, e.g., a thickness of the first layer 410 may be the same as a thickness of the second layer 420. For example, the plastic window 400 may have a vertical symmetric structure based on or about the first optical clear adhesive 430, and curling of the plastic window 400 may be reduced and/or prevented so that the plastic window 400 may be maintained in a flat state. For example, a plane of symmetry may pass between the first layer 410 and the second layer 420 or may extend along a center of first optical clear adhesive.

The coating layers 440 on the bottom surface of the first layer 410 and the top surface of the second layer 420, respectively, may have the same thicknesses and may have a pencil hardness of about 6 H or more. The coating layers 440 may be hard coating layers 440 and may be formed by coating an organic solvent (in which a hard coating solute is dissolved) onto the bottom surface of the first layer 410 and the top surface of the second layer 420. For example, the organic solvent may include toluene, and the hard coating solute may include an ultraviolet ray hardening type acryl-based solute.

Figure 4:
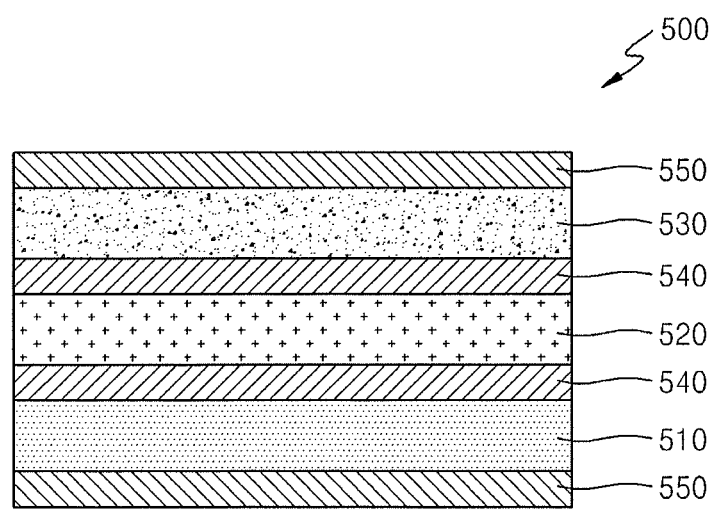
FIG. 4 illustrates a cross-sectional view of a modified example of the plastic window of FIG. 3.

FIG. 4 illustrates a cross-sectional view of a modified example of the plastic window 400 of FIG. 3.

The plastic window 500 illustrated in FIG. 4 may further include a third layer 520 between a first layer 510 and a second layer 530, as compared with the plastic window 400 of FIG. 3.

The first layer 510 and the second layer 530 may be the same as the first layer 410 and the second layer 420 illustrated in FIG. 3. For example, the first layer 510 and the second layer 530 may be formed of or may include polyethylene terephthalate, and hard coating layers 550 may be formed on a bottom surface of the first layer 510 and a top surface of the second layer 530, e.g., on outer, opposite facing surfaces of the first layer 510 and the second layer 530.

The third layer 520 may be formed of or may include polyethylene terephthalate. For example, the third layer 520 may be formed of or may include the same material used in forming the first layer 510 and the second layer 530. Thus, the entire thermal expansion coefficient of the plastic window 500 may be further reduced, so that adhesion reliability of the touch panel (see 300 of FIG. 1) may be further enhanced.

Each of the first layer 510 and the third layer 520 and the second layer 530 and the third layer 520 may be adhered to each other using a second optical clear adhesive 540. The second optical clear adhesive 540 may be formed of or may include a material that is substantially the same as that of the first optical clear adhesive 430 of FIG. 3.

The first layer 510 and the second layer 530 may have the same thicknesses as one another, and the plastic window 500 may have a vertical symmetric structure based on or about the third layer 520 (e.g., with respect to a plane of symmetry that extends along a center of the third layer 520). Thus, curling of the plastic window 500 may be reduced and/or prevented.

Figure 5:
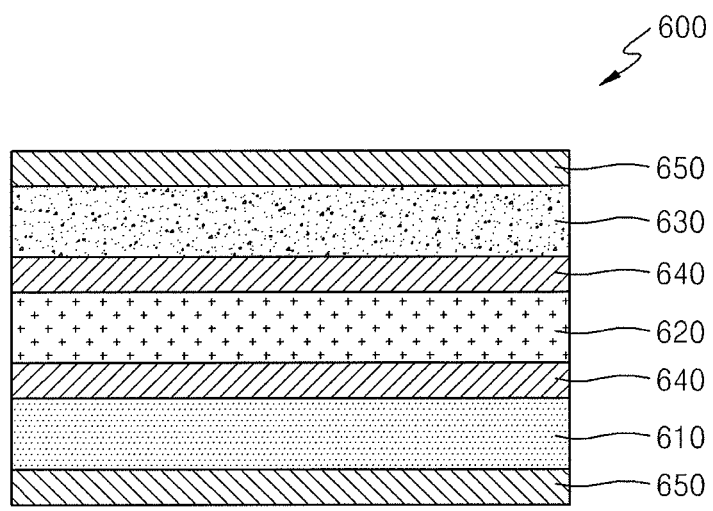
FIG. 5 illustrates a cross-sectional view of another modified example of the plastic window of FIG. 3.

FIG. 5 illustrates a cross-sectional view of another modified example of the plastic window 400 of FIG. 3.

The plastic window 600 illustrated in FIG. 5 may further include a third layer 620 between a first layer 610 and a second layer 630, as compared with the plastic window 400 of FIG. 3.

The first layer 610 and the second layer 630 may be the same as the first layer 410 and the second layer 420 illustrated in FIG. 3. For example, the first layer 610 and the second layer 630 may be formed of or may include polyethylene terephthalate, and hard coating layers 650 may be formed on a bottom surface of the first layer 610 and a top surface of the second layer 630, respectively. For example, hard coating layers 650 may be formed on outer, opposite facing surfaces of the first layer 610 and the second layer 630.

The third layer 620 may be formed of or may include polycarbonate. Polycarbonate may have excellent shock resistance, and when the third layer 620 is formed of or includes polycarbonate, a drop strength of the plastic window 600 may be improved. Thus, when the third layer 620 (between the first layer 610 and the second layer 630) is formed of or includes polycarbonate, and the first layer 610 and the second layer 630 are formed of or include polyethylene terephthalate, advantages of a shock resistance of polycarbonate and a small thermal expansion coefficient of polyethylene terephthalate may be simultaneously obtained.

The first layer 610 and the second layer 630 may have the same thicknesses as one another, and the plastic window 600 may have a vertical symmetric structure based on or about the third layer 620. Thus, curling of the plastic window 600 may be reduced and/or prevented. For example, the plastic window 600 may have a vertical symmetric structure with respect to a plane of symmetry that extends along a center of the third layer 620.

In addition, each of the first layer 610 and the third layer 620 and the second layer 630 and the third layer 620 may be adhered to each other using a second optical clear adhesive 640. The second optical clear adhesive 640 may be substantially the same as the second optical clear adhesive 540 of FIG. 4.

Results of testing adhesion reliability of a plastic window according to one or more embodiments are shown in Table 1, below, and will be described with reference to FIGS. 1 and 3 through 5.

Example 1 of the plastic window is illustrated in FIG. 3. In the first example, the first layer 410 and the second layer 420 were formed of polyethylene terephthalate so that the first layer 410 and the second layer 420 each had a thickness of 100 μm.

Example 2 of the plastic window is illustrated in FIG. 4. In the second example, the first layer 510, the second layer 530, and the third layer 520 were formed of polyethylene terephthalate, each of the first layer 510 and the second layer 530 was formed to have a thickness of 100 μm, and the third layer 520 was formed to have a thickness of 125 μm.

Example 3 of the plastic window is illustrated in FIG. 5. In the third example, each of the first layer 610 and the second layer 630 was formed to have a thickness of 100 μm, and the third layer 620 was formed to have a thickness of 100 μm.

In Comparative Example 1, a single layer having a thickness of 180 μm was formed of polycarbonate.

In each of Examples 1 to 3 and Comparative Example 1, seven samples were manufactured, and each of the samples was attached onto the touch panel (see 300 of FIG. 1) and then was left alone for 120 hours in an environment of 85° C. and humidity of 85%. Thereafter, a peeling-off test on each sample was performed. The peeling-off test was performed by determining whether each sample was peeled off from the touch panel (see 300 of FIG. 1). In Table 1, "O" means that the sample was not peeled off from the touch panel, and "X" means that the sample was peeled off from the touch panel.

TABLE 1

|  | Sample 1 | Sample 2 | Sample 3 | Sample 4 | Sample 5 | Sample 6 | Sample 7 |
|---|---|---|---|---|---|---|---|
| Example 1 | O | O | O | O | O | O | O |
| Example 2 | O | O | O | O | O | O | O |
| Example 3 | O | O | O | O | O | O | O |
| Comparative Example 1 | X | X | X | X | X | X | X |

As may be seen in Table 1, when a plastic window was formed of only polycarbonate, like in the Comparative Example 1, all samples were peeled off. This may be because polycarbonate had a large thermal expansion coefficient of about 65 ppm, and a difference in thermal expansion coefficients between the plastic window and the touch panel (see 300 of FIG. 1) was large so that adhesion reliability of the plastic window was lowered. In contrast, Examples 1 to 3 included layers formed of polyethylene terephthalate. Thus, a difference in thermal expansion coefficients between the plastic window 400, 500, or 600 and the touch panel (see 300 of FIG. 1) was reduced so that adhesion reliability of the plastic window 400, 500, or 600 was improved.

By way of summation and review, as display apparatuses have been developed, user interfaces (UIs) have also been developed. For example, various UIs may be provided so as to increase user's convenience of display apparatuses. UIs may include, e.g., touch interfaces that input data using a touch method. Display apparatuses may use a touch panel, instead of the existing keypad so as to provide these touch interfaces.

The touch panel may cause an indication content displayed on a screen to be directly contacted by a user's hand or an object and to be selected, thereby inputting a user's instruction. Thus, damage may occur in the sensitive touch panel. A window for protecting the touch panel may be attached onto an upper portion of the touch panel so as to help reduce the likelihood of and/or prevent damage from occurring in the touch panel.

The embodiments may provide a plastic window having improved adhesion reliability.

According to an embodiment, a difference in thermal expansion coefficients between a plastic window and a touch panel may be decreased so that peeling of the plastic window may be reduced and/or prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A plastic window, comprising:
a first layer;
a second layer stacked on the first layer; and
hard coating layers on an outer bottom surface of the first layer and on an outer top surface of the second layer, respectively, the outer top surface of the second layer facing a direction opposite to that of the outer bottom surface of the first layer,
wherein:
the first layer and the second layer each include polyethylene terephthalate, and
the first layer has the same thickness as the second layer.

2. The plastic window as claimed in claim 1, further comprising a third layer between the first layer and the second layer, the plastic window having a vertically symmetric structure with respect to a plane of symmetry that extends along a center of the third layer.

3. The plastic window as claimed in claim 2, wherein the third layer includes polyethylene terephthalate.

4. The plastic window as claimed in claim 2, wherein the third layer includes polycarbonate.

5. The plastic window as claimed in claim 1, wherein the first layer is adhered to the second layer with a first optical clear adhesive.

6. The plastic window as claimed in claim 2, wherein:
the first layer is adhered to the third layer with a second optical clear adhesive, and
the second layer is adhered to the third layer with the second optical clear adhesive.

7. The plastic window as claimed in claim 1, wherein the plastic window has a vertically symmetric structure with respect to a plane of symmetry that passes between the first layer and the second layer.

8. An organic light-emitting display apparatus, comprising:
a display unit;
a touch panel on the display unit; and
a plastic window attached onto the touch panel, wherein the plastic window includes:
a first layer on the touch panel; and
a second layer stacked on the first layer, and
wherein:
the first layer and the second layer each include polyethylene terephthalate,
the first layer has the same thickness as the second layer, and
the plastic window further includes hard coating layers on a bottom surface of the first layer and a top surface of the second layer, respectively, the top surface of the second layer facing an opposite direction relative to that of the bottom surface of the first layer.

9. The organic light-emitting display apparatus as claimed in claim 8, wherein a difference in thermal expansion coefficients between the touch panel and the plastic window is less than or equal to 20 ppm.

10. The organic light-emitting display apparatus as claimed in claim 8, wherein the plastic window further includes a third layer between the first layer and the second layer, the plastic window having a vertically symmetric structure with respect to a plane of symmetry that extends along a center of the third layer.

11. The organic light-emitting display apparatus as claimed in claim 10, wherein the third layer includes polyethylene terephthalate.

12. The organic light-emitting display apparatus as claimed in claim 10, wherein the third layer includes polycarbonate.

13. The organic light-emitting display apparatus as claimed in claim 8, further comprising an encapsulating layer on the display unit, wherein:
the display unit includes an organic light-emitting device, and
the encapsulating layer seals the display unit.

14. The organic light-emitting display apparatus as claimed in claim 13, wherein the touch panel is directly on the encapsulating layer.

15. The organic light-emitting display apparatus as claimed in claim 13, further comprising a polarizer between the encapsulating layer and the touch panel.

16. The organic light-emitting display apparatus as claimed in claim 8, wherein the plastic window has a vertically symmetric structure with respect to a plane of symmetry that passes between the first layer and the second layer.

\* \* \* \* \*